US006636541B1

(12) United States Patent
Nakayama et al.

(10) Patent No.: US 6,636,541 B1
(45) Date of Patent: Oct. 21, 2003

(54) SEMICONDUCTOR LASER DEVICE

(75) Inventors: Hisashi Nakayama, Osaka (JP);
Masahiro Kito, Osaka (JP); Masato Ishino, Osaka (JP); Yasushi Matsui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/516,835

(22) Filed: Mar. 2, 2000

(30) Foreign Application Priority Data

Mar. 2, 1999 (JP) .............................. 11-054117

(51) Int. Cl.[7] ................................................ H01S 5/00
(52) U.S. Cl. .............................. 372/45; 372/43; 372/46; 372/50
(58) Field of Search .............................. 372/43, 45, 39, 372/46, 50; 257/185

(56) References Cited

U.S. PATENT DOCUMENTS

| | | | |
|---|---|---|---|
| 5,473,173 A | * 12/1995 | Takiguchi et al. | .......... 257/185 |
| 5,555,271 A | 9/1996 | Honda et al. | |
| 5,734,670 A | 3/1998 | Ono et al. | |
| 5,889,805 A | 3/1999 | Botez et al. | |

* cited by examiner

*Primary Examiner*—Paul Ip
*Assistant Examiner*—Armando Rodriguez
(74) *Attorney, Agent, or Firm*—RatnerPrestia

(57) ABSTRACT

A semiconductor laser device includes a substrate, a p-type cladding layer and a n-type cladding layer provided on the substrate, and an active layer provided between the p-type cladding layer and the n-type cladding layer, having at least two barrier layers and at least two well layers, the barrier layers and the well layers being disposed alternately. Band offsets in a conduction band between the barrier layers and the well layers are provided so as to increase from the n-type cladding layer aide toward the p-type cladding layer side.

33 Claims, 4 Drawing Sheets

SEMICONDUCTOR LASER DEVICE

BACKGROUND OF THE INVENTION

1. Field of the Invention

The present invention relates to a semiconductor laser device.

2. Description of the Related Art

Optic-fiber communication systems, which have ultra-fast speed and broad band capabilities, have been practically used. An InGaAsP semiconductor laser device has been vigorously developed as a light source for use in such optic-fiber communication systems. In the InGaAsP semiconductor laser device, a substrate is made of InP, and layers are made of InGaAsP mixed crystal material which lattice-matches the InP substrate. The InGaAsP semiconductor laser device has current-light output characteristics which change greatly depending on the operating temperature. To obtain stable operation of the semiconductor laser device over a wide temperature range, a Peltier element is commonly used as a temperature control device. This results in an increase in the cost of a light module including the semiconductor laser device. To avoid the use of the temperature control device, a means for improving the temperature characteristic of the semiconductor laser device itself is desired.

The general features and characteristics of a semiconductor laser device having a multi-quantum-well structure will be briefly described. Among factors which determine the temperature characteristic of a semiconductor laser device is a so-called carrier overflow where electrons which are injected into an active layer are not confined in a well layer and then pass through the active layer. There is a known method for reducing the overflow in which the amount of light confined in the active layer is increased so that threshold-carrier density is lowered. This method has disadvantage such that the output light of the semiconductor laser device is deformed by changing the amount of the confined light.

There is another known method for reducing the carrier overflow in which the amount of confined light is not changed, but the forbidden band width of a barrier layer is increased so that the difference in the forbidden band width between the well layer and the barrier layer is increased. Although this method obtains a large band offset in the conduction band, the band offset in the valence band in also increased, resulting a reduction in hole injection efficiency.

Hereinafter, a conventional semiconductor laser device 200 will be described with reference to FIGS. 3, 4A and 4B.

FIG. 3 is a cross-sectional view illustrating the conventional semiconductor laser device 200. In FIG. 3, on an n-type InP substrate 201, an n-type InP cladding layer 202 having a thickness of 400 nm, an InGaAsP waveguide layer 203 having an energy bandgap wavelength of 1.05 µm and a thickness of 50 nm, an active layer 204, an InGaAsP waveguide layer 205 having an energy bandgap wavelength of 1.05 µm and a thickness of 50 nm, a p-type InP cladding layer 206 having a thickness of 400 nm, and a p-type InGaAsP contact layer 207 having a thickness of 200 nm are successively provided. An n-side electrode 210 and a p-side electrode 211 are provided on the lower side of the n-type InP substrate 201 and the upper side of the p-type InGaAsP contact layer 207, respectively.

The active layer 204 includes five InGaAsP well layers 208 having compressive strain and six InGaAsP barrier layers 209 having tensile strain which are alternately laminated. Here, the strain means an incommensurate structure between an InGaAsP layer and the n-type InP substrate 201. The degree of the strain is defined as the difference in the lattice constant. The degree of the strain is here specified by a strain factor represented by the following expressions:

$$(C_{208/209} - C_{201})/C_{201} \times 100(\%)$$

where $C_{208/209}$ is the lattice constant of the InGaAsP well layer 208 or the InGaAsP barrier layer 209, and $C_{201}$ is the lattice constant of the n-type InP substrate 201.

The InGaAsP well layer 208 has a greater lattice constant than that of the n-type InP substrate 201, so that the strain factor of the InGaAsP well layer 208 has a positive value. The InGaAsP barrier layer 209 has a smaller lattice constant than that of the n-type InP substrate 201, so that the strain factor of the InGaAsP barrier layer 209 has a negative value.

FIG. 4A is a diagram illustrating the strain factor of each semiconductor layer in the vicinity of the active layer 204 of the conventional semiconductor laser device 200. In FIG. 4A, the six InGaAsP layers 209 (indicated by intervals A) each have the same thickness of 10 nm and the same strain factor of −0.6%. The five InGaAsP layers 208 (indicated by intervals B) each have the same thickness of 6 nm and the same strain factor of 1.0%.

A strain amount of a layer is defined as a strain factor multiplied by a thickness of the layer. The strain amount of the whole active layer 204 is substantially zero because the positive strain amounts of the InGaAsP well layers 208 and the negative strain amounts of the InGaAsP barrier layers 209 are canceled.

The n-type InP cladding layer 202, the InGaAsP waveguide layer 203, the InGaAsP waveguide layer 205, and the p-type InP cladding layer 206 correspond to intervals C, D, E, and F, respectively, as shown in FIG. 4A.

FIG. 4B is a schematic diagram showing energy bands in the vicinity of the active layer 204. Intervals A to E indicate the respective layers of the semiconductor laser device 200, each of which corresponds to the same reference numeral in FIG. 4A. In FIG. 4B, each of the barrier layers 209 has the same energy bandgap. Band offsets X in the conduction band between the barrier layers 209 and the well layers 208 have the same value. Band offsets Y in the valence band between the barrier layers 209 and the well layers 208 have the same value. Here, a band offset is defined as the difference in an energy level between a barrier layer 209 and a well layer 208 which are adjacent to each other.

Next, the flow of electrons in the semiconductor laser device will be described. When a voltage is applied between an n-side electrode and a p-side electrode, electrons flow in the conduction band from the n-side electrode 210 to the InP substrate 201 to the n-type InP cladding layer 202 (interval C) to the InGaAsP waveguide layer 203 (interval D) to the active layer 204 (intervals A and B) to the InGaAsP waveguide layer 205 (Interval E) to the p-type InP cladding layer 206 (interval F) to the p-type InGaAsP contact layer 207 to the p-type electrode 211. At the same time, holes flow in the valence band from the p-type electrode 211 to the p-type InGaAsP contact layer 207 to the p-type InP cladding layer 206 (interval F) to the InGaAsP waveguide layer 205 (interval E) to the active layer 204 (intervals A and B) to the InGaAsP waveguide layer 203 (interval D) to the n-type InP cladding layer 202 (interval C) to the InP substrate 201 to the n-side electrode 210.

The electrons flowing in the conduction band and the holes flowing in the valence band recombine in the well layers 208 of the active layer 204, resulting in light emission.

In the conventional semiconductor laser device 200, however, the small band offset X in the conduction band between the barrier layer 209 and the well layer 208 causes electrons to overflow from the active layer 204.

Moreover, the great band offset Y in the valence band between the barrier layer 209 and the well layer 208 causes a nonuniform amount of hole injection.

One attempt to solve this problem may be made by increasing the absolute values of the strain factors of the barrier layer 209 and the well layer 208. In this case, however, the thicknesses of these layers exceed the limit of the critical thickness, so that crystal defects occur. Moreover, the thicknesses of the barrier layer 209 and the well layer 208 fluctuate, resulting in a loss in the flatness of these layers.

SUMMARY OF THE INVENTION

According to one aspect of the present invention, a semiconductor laser device includes a substrate; a p-type cladding layer and a n-type cladding layer provided on the substrate; and an active layer provided between the p-type cladding layer and the n-type cladding layer, having at least two barrier layers and at least two well layers, the at least two barrier layers and the at least well layers being disposed alternately. Band offsets in a conduction band between the at least two barrier layers and the at least two well layers are provided so as to increase from the n-type cladding layer side toward the p-type cladding layer side.

In one embodiment of this invention, lattice constants of the at least two well layers are greater than a lattice constant of the substrate.

In one embodiment of this invention, lattice constants of the barrier layers are less than a lattice constant of the substrate.

In one embodiment of this invention, the substrate, the p-type cladding layer, and the n-type cladding layer are made of InP.

In one embodiment of this invention, the active layer is made of InGaAsP.

In one embodiment of this invention, lattice constants of the at least two well layers are provided so as to increase from the n-type cladding layer side toward the p-type cladding layer side.

In one embodiment of this invention, lattice constants of the at least two barrier layers are provided so as to decrease from the n-type cladding layer side toward the p-type cladding layer side.

In one embodiment of this invention, the In molar fractions of the at least two well layers are provided to increase from the n-type cladding layer side toward the p-type cladding layer side.

In one embodiment of this invention, the In molar fractions of the at least two barrier layers are provided to decrease from the n-type cladding layer side toward the p-type cladding layer side.

In one embodiment of this invention, the at least two barrier layers each have the same energy bandgap.

In one embodiment of this invention, band offsets in a valence band between the at least two barrier layers and the at least two well layers are provided so as to decrease from the n-type cladding layer side toward the p-type cladding layer side.

In one embodiment of this invention, the at least two well layers have each the same energy bandgap.

In one embodiment of this invention, the sum of strain amounts of the at least two barrier layers and the at least two well layers in substantially zero.

In one embodiment of this invention, the strains between the at least two barrier layers and the at least two well layers are determined by the composition of each of the at least two barrier layers and the at least two well layers.

In one embodiment of this invention, the strain amount is represented by a strain factor multiplied by a layer thickness.

In one embodiment of this invention, the active layer is made of InGaAs.

In one embodiment of this invention, the active layer is made of InGaP.

According to another aspect of the present invention, a semiconductor laser device includes a substrate; a p-type cladding layer and a n-type cladding layer provided on the substrate; and an active layer provided between the p-type cladding layer and the n-type cladding layer, having at least two barrier layers and at least two well layers, the at least two barrier layers and the at least two well layers being disposed alternately. Band offsets in a valence band between the at least two barrier layers and the at least two well layers are provided so as to decrease from the n-type cladding layer side toward the p-type cladding layer side.

In one embodiment of this invention, lattice constants of the at least two well layers are greater than a lattice constant of the substrate.

In one embodiment of this invention, lattice constants of the at least two barrier layers are smaller than a lattice constant of the substrate.

In one embodiment of this invention, the substrate, the p-type cladding layer, and the n-type cladding layer are made of InP.

In one embodiment of this invention, the active layer is made of InGaAsP.

In one embodiment of this invention, lattice constants of the at least two well layers are provided so as to increase from the n-type cladding layer side toward the p-type cladding layer side.

In one embodiment of this invention, lattice constants of the at least two barrier layers are provided so as to decrease from the n-type cladding layer side toward the p-type cladding layer side.

In one embodiment of this invention, the In molar fractions of the at least two well layers are provided to increase from the n-type cladding layer side toward the p-type cladding layer side.

In one embodiment of this invention, the In molar fractions of the at least two barrier layers are provided to decrease from the n-type cladding layer side toward the p-type cladding layer side.

In one embodiment of this invention, the at least two barrier layers each have the same energy bandgap.

In one embodiment of this invention, the at least two well layers each have the same energy bandgap.

In one embodiment of this invention, the sum of strain amounts of the at least two barrier layers and the at least two well layers is substantially zero.

In one embodiment of this invention, the strains between the at least two barrier layers and the at least is two well layers are determined by the composition of each of the at least two barrier layers and the at least two well layers.

In one embodiment of this invention, the strain amount is represented by a strain factor multiplied by a layer thickness.

In one embodiment of this invention, the active layer is made of InGaAs.

In one embodiment of this invention, the active layer is made of InGaP.

In the semiconductor laser device of the present invention, the band offsets in the conduction band between the barrier layers and the well layers are gradually increased from the n-type cladding layer side toward the p-type cladding layer side. This prevents electron overflow as well as crystal defects in the active layer Thus, the invention described herein makes possible the advantages of (1) providing a semiconductor laser device in which the strain factors of the InGaAsP well layers 208 are increased without degrading crystalline quality, and the band offsets X in the conduction band between the barrier layers 209 and the well layers 208 are increased so that the electron overflow is prevented, thereby reducing a change in the current-light output characteristics due to temperature variations.

These and other advantages of the present invention will become apparent to those skilled in the art upon reading and understanding the following detailed description with reference to the accompanying figures.

DESCRIPTION OF THE PREFERRED EMBODIMENTS

A semiconductor laser device 100 according to an example of the present invention will be described below with reference to FIGS. 1, 2A and 2B.

Figure 1:
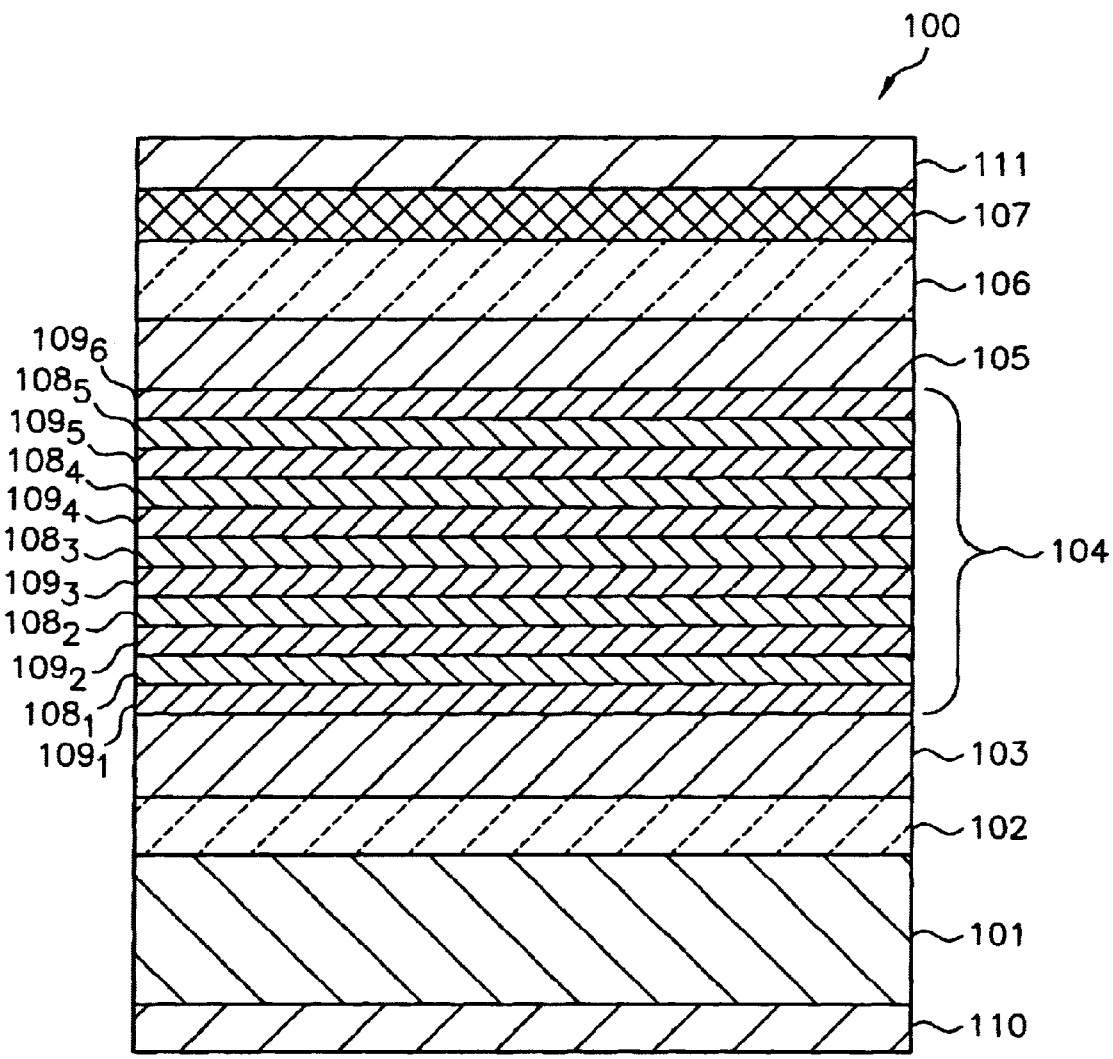
FIG. 1 is a cross-sectional view illustrating a semiconductor laser device according to an example of the present invention.

FIG. 1 is a cross-sectional view illustrating the semiconductor laser device 100. As shown in FIG. 1, on an n-type InP substrate 101, an n-type InP cladding layer 102 having a thickness of 400 nm, an InGaAsP waveguide layer 103 having an energy bandgap wavelength of 1.05 μm and a thickness of 50 nm, an active layer 104, an InGaAsP waveguide layer 105 having an energy bandgap wavelength of 1.05 μm and a thickness of 50 nm, a p-type InP cladding layer 106 having a thickness of 400 nm, and a p-type InGaAsP contact layer 107 having a thickness of 200 nm are successively provided. Further, an n-side electrode 110 and a p-side electrode 111 are provided on the lower surface of the n-type InP substrate 101 and the upper surface of the p-side InGaAsP contact layer 107, respectively.

The active layer 104 includes five InGaAsP well layers $108_1$ to $108_5$ having compressive strain and six InGaAsP barrier layers $109_1$ to $109_6$ having tensile strain, which are alternately laminated. The well layers $108_1$ to $108_5$ have the same energy bandgap wavelength of 1.55 μm. The barrier layers $109_1$ to $109_6$ have the same energy bandgap wavelength of 1.05 μm. The strain factors of these layers are determined by setting a molar fraction ratio of In to Ga and a molar fraction ratio of As to P, i.e., setting molar fractions x and 1−x of Ga and In, respectively; and molar fractions y and 1−y of As and P, respectively, in a composition $Ga_xIn_{1-x}As_yP_{1-y}$.

The InGaAsP well layer $108_1$ to $108_5$ have greater lattice constants than that of the n-type InP substrate 101, so that the strain factors of the InGaAsP well layers $108_1$ to $108_5$ have a positive value. The InGaAsP barrier layers $109_1$ to $109_6$ has smaller lattice constants than that of the n-type InP substrate 101, so that the strain factors of the InGaAsP barrier layer $109_1$ to $109_6$ have a negative value.

Figure 2A:
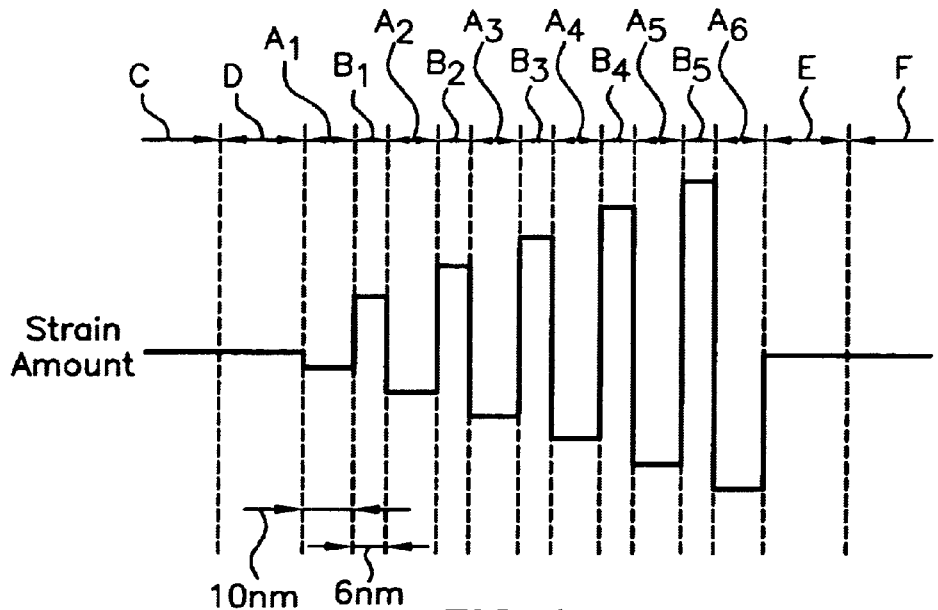
FIG. 2A is a diagram illustrating strain factors in the semiconductor laser device of the present invention.

FIG. 2A in a diagram illustrating the strain factor of each semiconductor layer in the vicinity of the active layer 104 of the semiconductor laser device 100. The n-type InP cladding layer 102, the InGaAsP waveguide layer 103, the InGaAsP waveguide layer 105, and the p-type InP cladding layer 106 correspond to intervals C, D, E, and F, respectively, as shown in FIG. 2A. In FIG. 2A, the six InGaAsP barrier layers $109_1$ to $109_6$ (indicated by intervals $A_1$ to $A_6$) each have the same thickness of 10 nm. A pair of the molar fractions x and y for each of the six InGaAsP barrier layers $109_1$ to $109_6$ are (x=0.202, y0.317), (x=0.229, y=0.344), (x=0.255, y=0.370), (x=0.287, y=0.408), (x=0.314, y=0.434), and (x=0.345, y=0.471), respectively. Accordingly, the strain factors of the six InGaAsP barrier layers $109_1$ to $109_6$ are −0.4%, −0.5%, −0.6%, −0.7%, −0.8%, and −0.9%, respectively. The absolute values of the strain factors is gradually increased toward the p-type InP cladding layer 106 side (interval F side). This is because a molar fraction of In is gradually decreased from the n-type InP cladding layer 102 side (interval C side) toward the p-type InP cladding layer 106 side (interval F side).

The five InGaAsP well layers $108_1$ to $108_5$ (indicated by intervals $B_1$ to $B_5$) each have the same thickness of 6 nm. A pair of the molar fractions x and y for each of the five InGaAsP well layers $108_1$ to $108_5$ are (x=0.108, y=0.614), (x=0.085, y=0.594), (x=0.061, y=0.575), (x=0.040, y=0.559), and (x=0.018, y=0.543), respectively. Accordingly, the strain factors of the five InGaAsP well layers $108_1$ to $108_5$ are 1.23%, 1.33%, 1.43%, 1.53%, and 1.63%, respectively. The absolute values of the strain factors is gradually increased toward the p-type InP cladding layer 106 side (interval F side). This is because a molar fraction of In is gradually increased from the n-type InP cladding layer 102 side (interval C side) toward the p-type InP cladding layer 106 side (interval F side).

The strain amount of the whole active layer 104 is substantially zero because the positive strain amounts of the InGaAsP well layers $108_1$ to $108_5$ and the negative strain amounts of the InGaAsP barrier layers $109_1$ to $109_6$ are canceled.

Figure 2B:
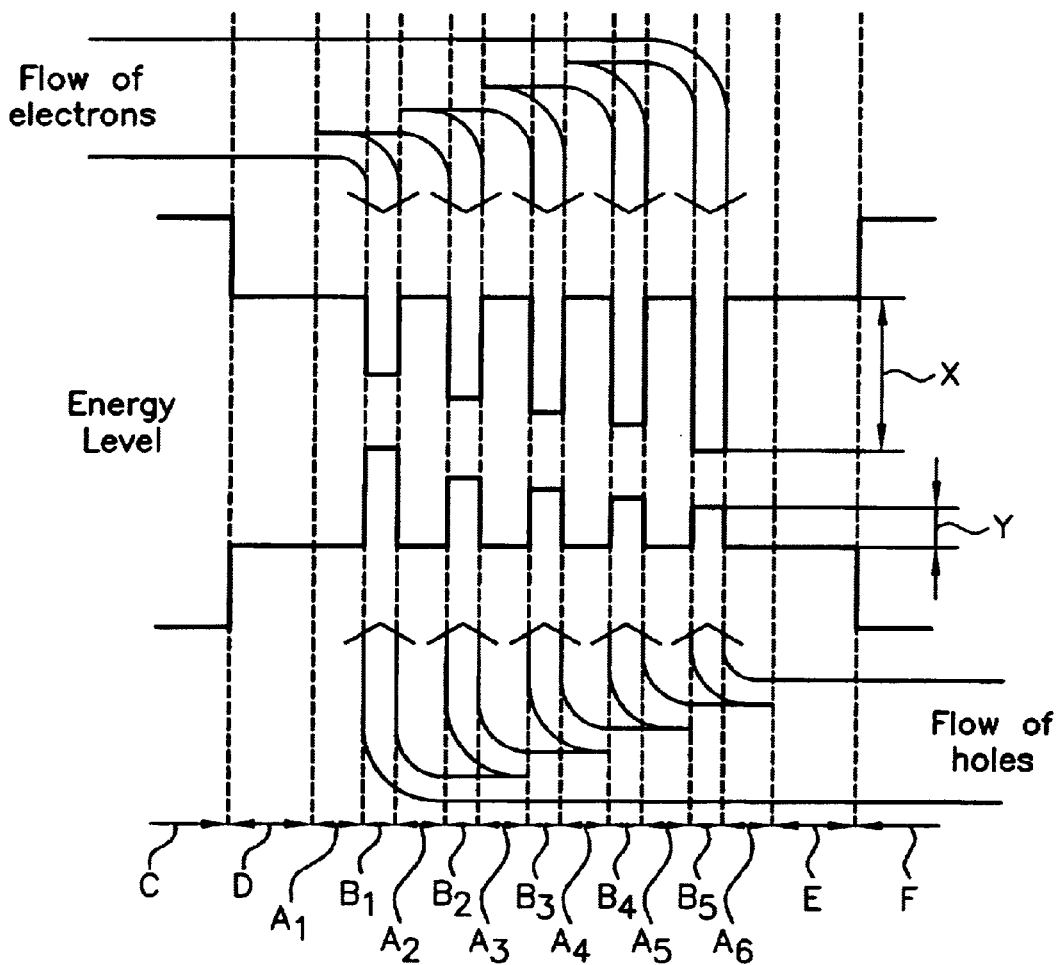
FIG. 2B is a diagram illustrating energy bandgaps in the semiconductor laser device of the present invention.
Figure 3:
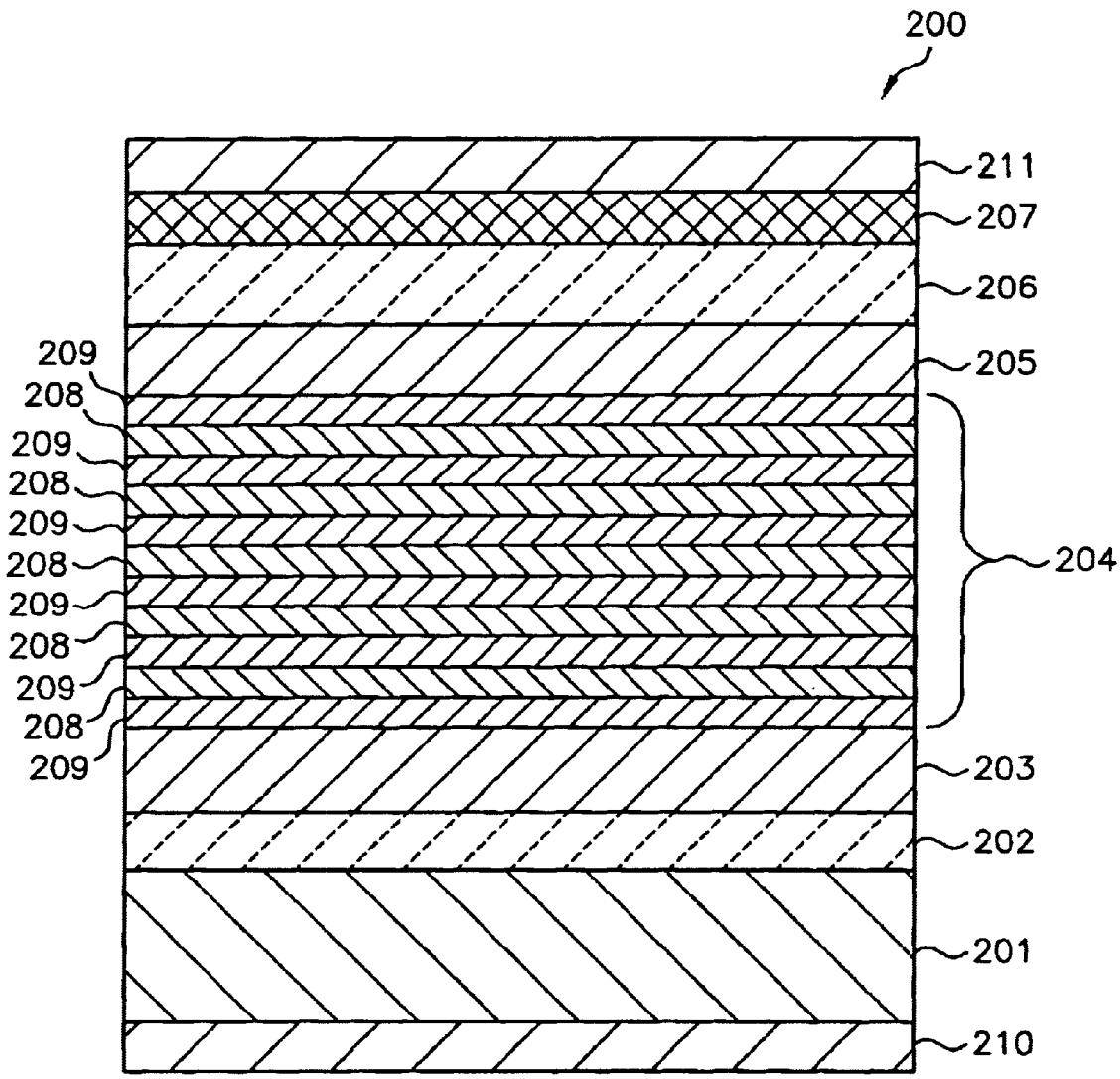
FIG. 3 is a cross-sectional view of a conventional semiconductor laser device.
Figure 4A:
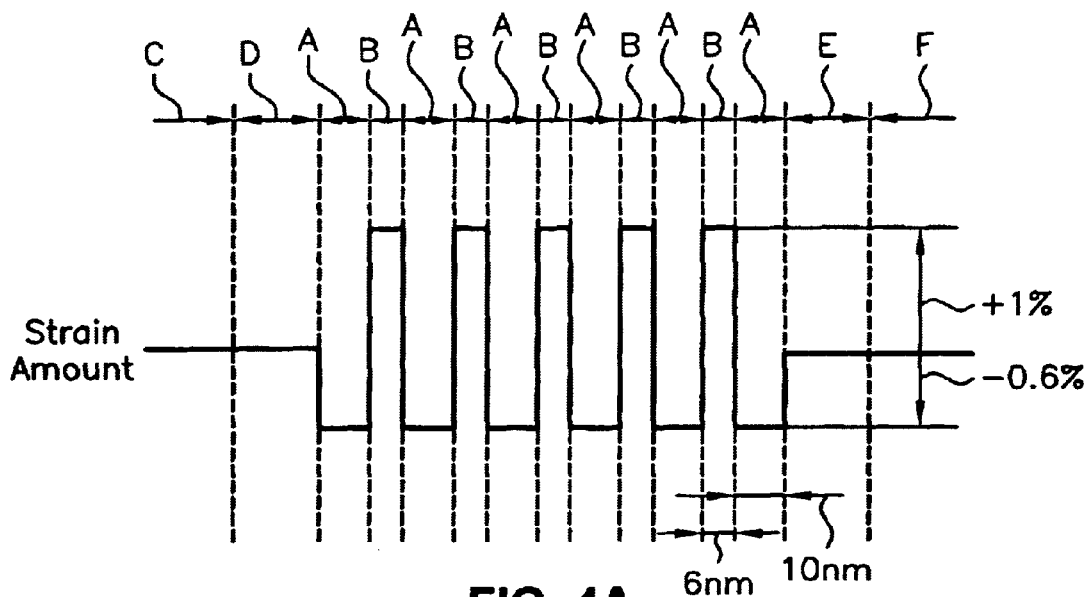
FIG. 4A is a diagram illustrating strain factors in the conventional semiconductor laser device.
Figure 4B:
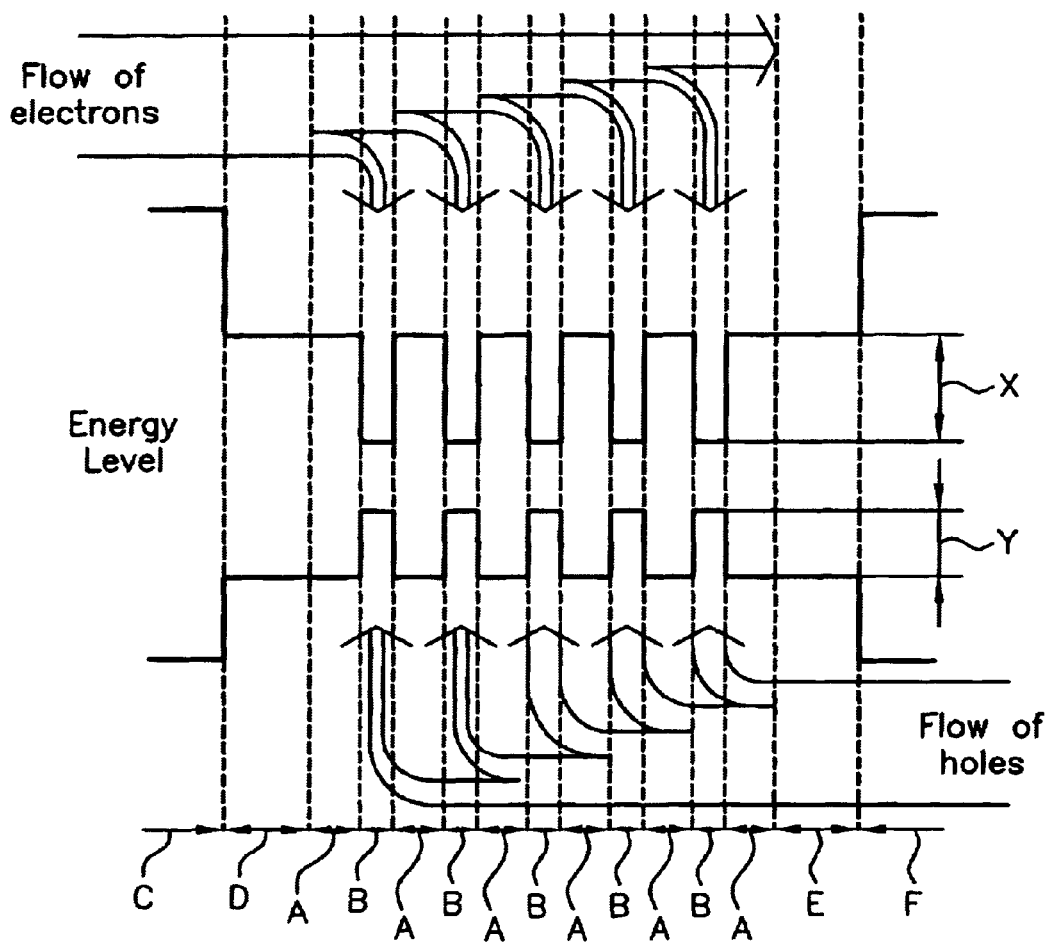
FIG. 4B is a diagram illustrating energy bandgaps in the conventional semiconductor laser device.

FIG. 2B is a schematic diagram showing energy bands in the vicinity of the active layer 104. In FIG. 2B. each of the barrier layers $109_1$ to $109_6$ has the same energy bandgap. This is obtained due to the above-described molar fractions x, y of each layer in the active layer 104. The band offset X in the conduction band between the adjacent barrier layer $109_n$ and well layer $108_m$ ($|n-m|\leq 1$ where n and m are natural numbers) is increased from the n-type InP cladding layer 102 side (interval C side) toward the p-type InP cladding layer 106 side (interval F side). The increased band offset X prevents the electron overflow.

The band offset Y in the valence band between the adjacent barrier layer $109_n$ and well layer $108_m$ ($|n-m|\leq 1$ where n and m are natural numbers) is decreased from the n-type InP cladding layer 102 side (interval C side) toward the p-type InP cladding layer 106 side (interval F side). The decreased band offset Y prevents the nonuniform hole injection efficiency. This is because the closer the well layer is to the p-type cladding layer 106 (i.e., the lesser the band offset Y in the valence band), the greater the hole current, resulting in more uniform hole injection efficiency.

Preferably, the well layers $108_1$ to $108_5$ in the active layer 104 have the same energy bandgap between the valence band and the conduction band. This is because the same energy bandgap among the well layers leads to uniform efficiency of electron-and-hole recombination.

As described above, the semiconductor layers having the great strain amounts are limited to a portion of the active layer 104. This prevents variations in the thickness of each of the InGaAsP barrier layers $109_1$ to $109_6$ and the InGaAsP well layers $108_1$ to $108_5$, thereby obtaining a quantum-well structure which is flat at an atomic level and has a high quality.

The active layer 104 having such a multi-quantum-well structure may be grown using metal-organic vapor phase epitaxy (MOVPE), gas source molecular beam epitaxy (MBE), or the like.

The semiconductor laser device structure may be of planer type, selfaligned stripe (SAS) type, buried hetero (BH) type, double channel planar buried hetero (DCPBH) type, or the like.

The active layer 104 may be made of InGaAs or InAsP.

In the above-described method, the band offsets in the valence and conduction band& between the InGaAsP barrier layers $109_1$ to $109_6$ and the InGaAsP well layers $108_1$ to $108_5$ are determined by changing the strain amounts. Alternatively, the band offset may be changed using nitride mixed crystal, such as InGaNAs or InGaNP, which includes nitride as V group material.

Those skilled in the art should understand that although, in the above-described examples, the barrier layers have the same energy bandgap, the present invention is not limited to this.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising;
   a substrate;
   a p-type cladding layer and a n-type cladding layer on the substrate; and
   an active layer, between the p-type cladding layer and the n-type cladding layer, including at least two barrier layers having the same first thicknesses and at least two well layers having the same second thicknesses, the at least two barrier layers and the at least two well layers being laminated and disposed alternately,
   wherein the strain amount of the at least two barrier layers decreases from the n-type cladding layer side toward the p-type cladding layer side according to the alternately disposed laminated barrier layers and the strain amount of the at least two well layers increases from the n-type cladding layer side toward the p-type cladding layer side such that band offsets in a conduction band between the at least two barrier layers and the at least two well layers increase from the n-type cladding layer side toward the p-type cladding layer side according to the other alternately disposed laminated well layers.

2. A semiconductor laser device according to claim 1, wherein lattice constants of the at least two well layers are greater than a lattice constant of the substrate.

3. A semiconductor laser device according to claim 1, wherein lattice constants of the barrier layers are less than a lattice constant of the substrate.

4. A semiconductor laser device according to claim 1, wherein the substrate, the p-type cladding layer, and the n-type cladding layer are made of InP.

5. A semiconductor laser device according to claim 1, wherein the active layer is made of InGaAsP.

6. A semiconductor laser device according to claim 2, wherein lattice constants of the at least two well layers increase from the n-type cladding layer side toward the p-type cladding layer side.

7. A semiconductor laser device according to claim 3, wherein lattice constants of the at least two barrier layers decrease from the n-type cladding layer side toward the p-type cladding layer side.

8. A semiconductor laser device according to claim 5, wherein the In molar fractions of the at least two well layers increase from the n-type cladding layer side toward the p-type cladding layer side.

9. A semiconductor laser device according to claim 5, wherein the In molar fractions of the at least two barrier layers decrease from the n-type cladding layer side toward the p-type cladding layer side.

10. A semiconductor laser device according to claim 1, wherein the at least two barrier layers each have the same energy bandgap.

11. A semiconductor laser device according to claim 1, wherein band offsets in a valence band between the at least two barrier layers and the at least two well layers decrease from the n-type cladding layer side toward the p-type cladding layer side.

12. A semiconductor laser device according to claim 1, wherein the at least two well layers have each the same energy bandgap.

13. A semiconductor laser device according to claim 1, wherein the sum of strain amounts of the at least two barrier layers and the at least two well layers is substantially zero.

14. A semiconductor laser device according to claim 13, wherein the strains between the at least two barrier layers and the at least two well layers are dependent on the composition of each of the at least two barrier layers and the at least two well layers.

15. A semiconductor laser device according to claim 13, wherein the strain amount is represented by a strain factor multiplied by a layer thickness.

16. A semiconductor laser device comprising;
    a substrate;
    a p-type cladding layer and a n-type cladding layer on the substrate; and
    an active layer, between the p-type cladding layer and the n-type cladding layer, including at least two barrier layers having the same first thicknesses and at least two well layers having the same second thicknesses, the at least two barrier layers and the at least two well layers being laminated and disposed alternately,
    wherein the strain amount of the at least two barrier layers decreases from the n-type cladding layer side toward the p-type cladding layer side according to the alternately disposed laminated barrier layers and the strain amount of the at least two well layers increases from the n-type cladding layer side toward the p-type cladding layer side such that band offsets in a valence band between the at least two barrier layers and the at least two well layers decrease from the n-type cladding layer side toward the p-type cladding layer side according to the other alternately disposed laminated well layers.

17. A semiconductor laser device according to claim 16, wherein lattice constants of the at least two well layers are greater than a lattice constant of the substrate.

18. A semiconductor laser device according to claim 16, wherein lattice constants of the at least two barrier layers are smaller than a lattice constant of the substrate.

19. A semiconductor laser device according to claim 16, wherein the substrate, the p-type cladding layer, and the n-type cladding layer are made of InP.

20. A semiconductor laser device according to claim 16, wherein the active layer is made of InGaAsP.

21. A semiconductor laser device according to claim 17, wherein lattice constants of the at least two well layers increase from the n-type cladding layer side toward the p-type cladding layer side.

22. A semiconductor laser device according to claim 18, wherein lattice constants of the at least two barrier layers decrease from the n-type cladding layer side toward the p-type cladding layer side.

23. A semiconductor laser device according to claim 20, wherein the In molar fractions of the at least two well layers increase from the n-type cladding layer side toward the p-type cladding layer side.

24. A semiconductor laser device according to claim 20, wherein the In molar fractions of the at least two barrier layers decrease from the n-type cladding layer side toward the p-type cladding layer side.

25. A semiconductor laser device according to claim 16, wherein the at least two barrier layers each have the same energy bandgap.

26. A semiconductor laser device according to claim 16, wherein the at least two well layers each have the same energy bandgap.

27. A semiconductor laser device according to claim 16, wherein the sum of strain amounts of the at least two barrier layers and the at least two well layers is substantially zero.

28. A semiconductor laser device according to claim 27, wherein the strains between the at least two barrier layers and the at least two well layers are dependent on the composition of each of the at least two barrier layers and the at least two well layers.

29. A semiconductor laser device according to claim 27, wherein the strain amount is represented by a strain factor multiplied by a layer thickness.

30. A semiconductor laser device according to claim 1, wherein the active layer includes InGaAs.

31. A semiconductor laser device according to claim 1, wherein the active layer includes InGaP.

32. A semiconductor laser device according to claim 16, wherein the active layer includes InGaAs.

33. A semiconductor laser device according to claim 16, wherein the active layer includes InGaP.

* * * * *